(12) United States Patent
Pikhay et al.

(10) Patent No.: US 7,400,538 B2  
(45) Date of Patent: Jul. 15, 2008

(54) NROM MEMORY DEVICE WITH ENHANCED ENDURANCE

(75) Inventors: Evgeny Pikhay, Migdal Haemek (IL); Yakov Roizin, Migdal Haemek (IL); Alexey Heiman, Migdal Haemek (IL); Amos Fenigstein, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 50 days.

(21) Appl. No.: 11/539,156

(22) Filed: Oct. 5, 2006

(65) Prior Publication Data

US 2008/0084764 A1  Apr. 10, 2008

(51) Int. Cl.  
G11C 11/34 (2006.01)  
G11C 16/04 (2006.01)  
G11C 16/06 (2006.01)

(52) U.S. Cl. ............. 365/185.29; 365/185.19; 365/185.22; 365/185.33

(58) Field of Classification Search ............ 365/185.18, 365/185.19, 185.22, 185.29, 185.33  
See application file for complete search history.

(56) References Cited

U.S. PATENT DOCUMENTS

| | | | |
|---|---|---|---|
| 6,266,281 B1 * | 7/2001 | Derhacobian et al. | 365/185.29 |
| 6,760,270 B2 | 7/2004 | Chindalore et al. | |
| 6,834,012 B1 * | 12/2004 | He et al. | 365/185.18 |
| 6,894,931 B2 * | 5/2005 | Yaegashi et al. | 365/185.22 |
| 6,901,010 B1 * | 5/2005 | Hamilton et al. | 365/185.22 |
| 6,937,521 B2 * | 8/2005 | Avni et al. | 365/185.22 |
| 7,060,627 B2 | 6/2006 | Gutman et al. | |
| 2005/0237801 A1 | 10/2005 | Shih | |
| 2006/0094257 A1 | 5/2006 | Hoffman et al. | |
| 2008/0037330 A1 * | 2/2008 | Park et al. | 365/185.22 |

OTHER PUBLICATIONS

Chindalore et al: "A New Combination-Erase Technique For Erasing Nitride Based (SONOS) Nonvolatile Memories", IEEE Electron Device Letters, vol. 24, No. 4, Apr. 2003 Silicon Devices, pp. 257-259.

Shih et al.: "A Novel 2-bit/cell Nitride Storage Flash Memory With Greater Than 1M P/E-cycle Endurance", 2004 IEEE, 4 pages.

* cited by examiner

*Primary Examiner*—Ly D Pham  
(74) *Attorney, Agent, or Firm*—Bever, Hoffman & Harms, LLP; Patrick T. Bever (57) ABSTRACT

The efficient removal of parasitic electron charges from the ONO structure of an NROM cell by periodically applying a negative gate refresh voltage in a way that injects holes from the substrate into the ONO structure. Initially, after each erase pulse is generated and an unacceptable erase state is detected, the erase pulse magnitude is incrementally increased to compensate for the increasing parasitic electrons. When a predetermined maximum drain voltage is reached, the negative gate refresh voltage is applied to refresh the ONO structure, and the drain voltage is reset to an initial state. A novel NROM cell uses a P+ doped polysilicon gate or Top Oxide produced with a high-k dielectric (Alumina) to facilitate blocking the injection of gate electrons, and the Bottom Oxide thickness is selectively thinned to increase hole injection.

12 Claims, 8 Drawing Sheets

NROM MEMORY DEVICE WITH ENHANCED ENDURANCE

FIELD OF THE INVENTION

The present invention relates to nitride read only memory (NROM) devices, and in particular to methods and structures for increasing the program/erase cycle endurance of NROM devices.

BACKGROUND OF THE INVENTION

Figure 10:
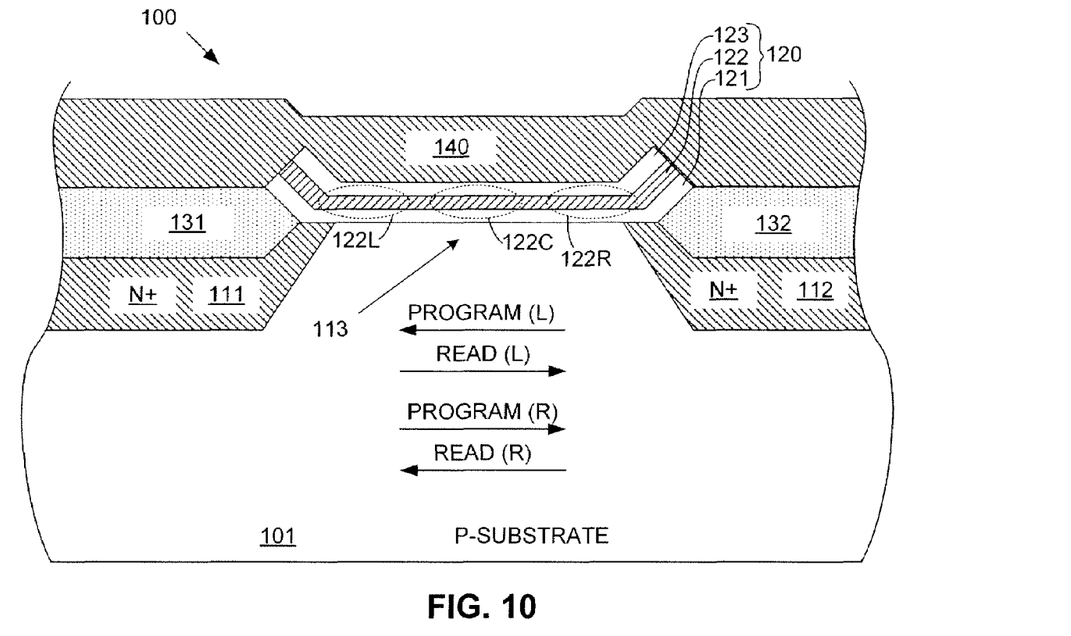
FIG. 10 is a simplified cross-sectional side view illustrating a conventional NROM cell.

FIG. 10 is a cross sectional view of a conventional nitride read only memory (NROM) cell 100, which is a type of non-volatile memory (NVM) device that implements a silicon-oxide-nitride-oxide-silicon (SONOS) structure. NROM cell 100 includes p-type substrate 101, N+ source/drain (and diffusion bit line) regions 111 and 112, channel region 113, oxide-nitride-oxide (ONO) structure 120, bit line oxide regions 131 and 132, and an N-type polycrystalline silicon ("polysilicon") control gate 140. ONO structure 120 includes lower (bottom) silicon oxide layer 121, silicon nitride layer 122 and upper silicon oxide layer 123. NROM cell 100 features two-bit per cell storage, with two data bits being stored in two separate charge trapping regions 122L and 122R in nitride layer 122. Thus, data is stored as charges in the ONO structure 120 at the edges of a memory transistor channel 113. NROM cell 100 is described in more detail in U.S. Pat. No. 5,768,192 to Eitan.

Programming NROM cell 100 requires increasing the threshold voltage of the cell. Programming typically involves applying a positive voltage to the gate 140 and a positive voltage to the drain (111 or 112) while the source (112 or 111) is grounded. The channel electrons are accelerated in the lateral field. The electrons eventually achieve sufficient energy to be injected into the silicon nitride layer 122, this being known as hot electron injection. When the drain and the gate voltages are no longer present, the bottom oxide layer 121 and the top oxide layer 123 of the ONO structure 120 prevent electrons from moving to the substrate 101 or the gate 140. An erase operation is performed by injecting holes generated in the drain (111 or 112) into the ONO structure 120 by a band-to-band tunneling mechanism. During erase operations, a positive voltage is applied to the drain (111 or 112) and a negative (or zero) voltage is applied to the gate 140. During read-out operations, the drain current is sensed in the direction "reverse" to the programming current, as indicated at the bottom of FIG. 10.

The major advantage of NROM cell 100 is the local charge trapping in charge trapping regions 122L and 122R, instead of in an entire floating gate structure as in conventional floating gate poly EEPROM cells. This local charge trapping arrangement enables NROM cell 100 to utilize significantly lower charge quantity to influence the cell threshold voltage Vt during read-out operations, in comparison to floating gate poly EEPROM cells. In addition, the local charge trapping arrangement facilitates "two bit operation"—i.e., programming the cell in different directions to store two bits of information in the single cell.

Figure 11:
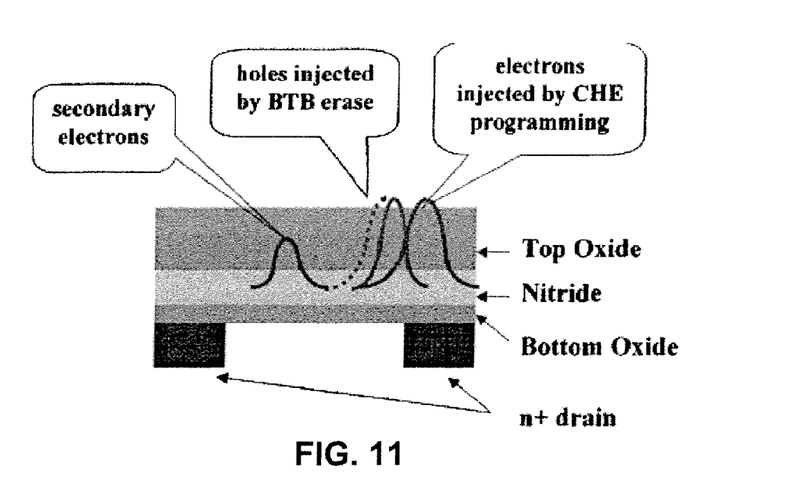
FIG. 11 is a simplified cross-sectional side view illustrating parasitic charge trapping in a conventional NROM cell.

Although conventional NMOS cells provide many advantages over floating gate poly EEPROM cells, they also present unique problems. One problem associated with SONOS NMOS memory cells is that the charge trapping is not perfectly local; that is, some electrons are trapped far from drain edge (see FIG. 11), and these electrons cannot be erased efficiently using the conventional BBT erase process that generates local hole injection only near the drain. Thus, the endurance of NROM cells is limited due to the inability of the standard erase process to erase the parasitic electrons trapped in Bottom Oxide (BOX) and Nitride layers far from the drain edge. In addition, cell endurance is further limited by hot carrier degradation of the BOX layer due to hot carriers creating traps in the BOX layer during cycling, which are filled by the parasitic electrons, thus creating a closed positive feedback degradation loop (i.e., trap creation—electron trapping—erase voltage increases—more holes injected—more trap generation in the BOX layer far from the drain).

It is of great commercial importance to the manufacturers of NROM technology devices to provide NMOS cells that have a program/erase endurance of more than ten million cycles. Such endurance opens new business/marketing perspectives (for example, applications connected with recurrent storage of information, typical for automotive and image processing systems). Thus, there is a need for the manufacturers of NROM technology devices to overcome the parasitic electron trapping problem described above, thereby increasing the program/erase endurance of NROM devices to more than ten million cycles.

Conventional methods that attempt to address the problem of parasitic electrons trapped far from the drain edge are disclosed in U.S. Pat. No. 6,760,270 "Erase of a non-volatile memory" (herein "the Chindalore patent"), "A New Combination-Erase Technique for Erasing Nitride Based (SONOS) Nonvolatile Memories", Chindalore et al., IEEE ELECTRON DEVICE LETTERS, VOL. 24, NO. 4, APRIL 2003 Silicon Devices (herein "the Chindalore article"), U.S. Patent Pub. No. 20050237801 "Operation scheme with charge balancing for charge trapping non-volatile memory" (herein "the Shih patent"), and "A Novel 2-bit/cell Nitride Storage Flash Memory with Greater than 1M P/E-cycle Endurance", Yen-Hao Shih, et.al., IEDM 2004 pg. 881 (herein "the Shih article"). These references generally teach hole injection from the substrate in NROM type device operation.

The approach taught in the Chindalore patent and article includes performing a hole injection procedure before the BBT erase process with the aim of decreasing the damage by BBT holes. This hole injection procedure involves thinning the BOX to 30 angstroms (30 A), and using a Fowler-Nordheim (F-N) erase stage at the beginning of each program/erase cycles. This approach has serious limitations. First, the F-N erase stage helps to discharge main distribution of electrons trapped in the drain region, but does not remove electrons trapped far from the drain. Second, the F-N erase stage strongly increases the erase time of NROM devices. Third, the voltages needed for erase are higher than in conventional NROM processes. Thus, this approach fails to overcome the parasitic electron problem in a manner that yields adequate program/erase endurance.

The approach taught in the Shih patent and article includes increasing the initial threshold voltage (Vt) of the memory cells above 3.5V by uniform F-N injection of electrons from the substrate using a positive gate voltage exceeding 20V. This approach makes a strong initial misbalance of electric fields in the ONO structure. The BOX layer field is initially high, which further allows enhancement by negative voltage at the polysilicon gate, and thus hole injection into the ONO structure. However, this approach also has serious limitations. First, increasing of the initial threshold voltage level assumes occupying of a large number of SiN traps. Thus, further large cycling windows can not be achieved due to the lack of available traps. Second, the readout voltage has to be strongly increased (above 4.5V to 5V), and thus additional high voltage circuitry is needed in design to support this voltage. Third, no protection circuits against plasma charging can be employed (otherwise the initial F-N p-injection is not feasible). Absence of protection makes the technology strongly dependent on Plasma potentials in the back/end of the process flow. The result is strong fluctuations of the initial threshold voltage, thus resulting in serious problems in array operation.

What is needed is an operating method and structure that increases the program/erase cycle endurance of NROM cells while avoiding the problems associated with the conventional approaches described above.

SUMMARY OF THE INVENTION

The present invention is directed to a novel NROM operational algorithm and cell structure that facilitate the efficient removal of parasitic electron charges trapped far from the drain by periodically applying a negative gate refresh voltage in a way that injects holes from the substrate into the ONO structure, thereby achieving an exclusive endurance/retention performance for NROM devices while preserving the advantages associated with NROM devices.

In accordance with an embodiment of the present invention, an erase operation includes applying an erase pulse across the targeted charged trapping region, determining the resulting erased state, and then either increasing the magnitude of the erase pulse or applying the negative gate refresh voltage. The erase pulse is initially produced by generating a fixed negative voltage in the control gate and an initial, relatively low positive drain voltage in the associate drain region such that holes are injected into the targeted charge trapping region from the associated drain region. As parasitic electrons gradually build up in the ONO structure, the erase pulse becomes insufficient to achieve the acceptable erased state, and therefore the magnitude of the erase pulse is increased, for example, by incrementally increasing the positive drain voltage. The process of incrementally increasing the positive drain voltage in response to the increasing parasitic electrons is repeated until the positive drain voltage reaches a predetermined voltage level. When this occurs, the negative gate refresh voltage is applied for a predetermined duration such that holes enter the ONO structure from the substrate, thus reducing or eliminating the parasitic electrons. With the parasitic electrons substantially removed from the ONO structure, the required magnitude erase pulse needed to achieve an acceptable erased state is reduced. Therefore, the positive drain voltage is reset to its initial state, and the next subsequent erase pulse is generated using the initial magnitude. Thus, similar to the approach taught in the Shih references (discussed above), electrons are removed from the middle of the ONO structure using a negative gate voltage that draws holes from the substrate into the middle of the ONO structure. However, unlike the approach taught by Shih, the present invention applies the refresh voltage without requiring an initial F-N injection procedure, which has the effect of increasing the initial Vt of the NROM cell, and is thus implemented with a lower (absolute) "refresh" gate voltage.

In accordance with another embodiment of the present invention, a novel NROM cell is utilized that is modified to block electron injection from the control gate, and optionally to intensify the injection of holes from the substrate. In one embodiment, the memory cell is produced with a P+ doped polysilicon gate (instead of the N+ polysilicon typically utilized in conventional NMOS cells), and a decreased Bottom Oxide (BOX) thickness (e.g., to near-tunneling values). In another embodiment, the BOX is produced with its standard thickness, but the Top Oxide (TOX) is produced with a high-k dielectric (Alumina) that facilitates blocking the injection of gate electrons. In each of these embodiments, application of the negative gate stress that is much lower than in conventional methods leads to the removal of the electrons trapped far from drain, and a decrease of the drain erase voltage to its initial value. Thus, the number of holes used during the erase process is significantly decreased, and the cell endurance is improved dramatically (i.e., on the order of 10 million cycles).

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
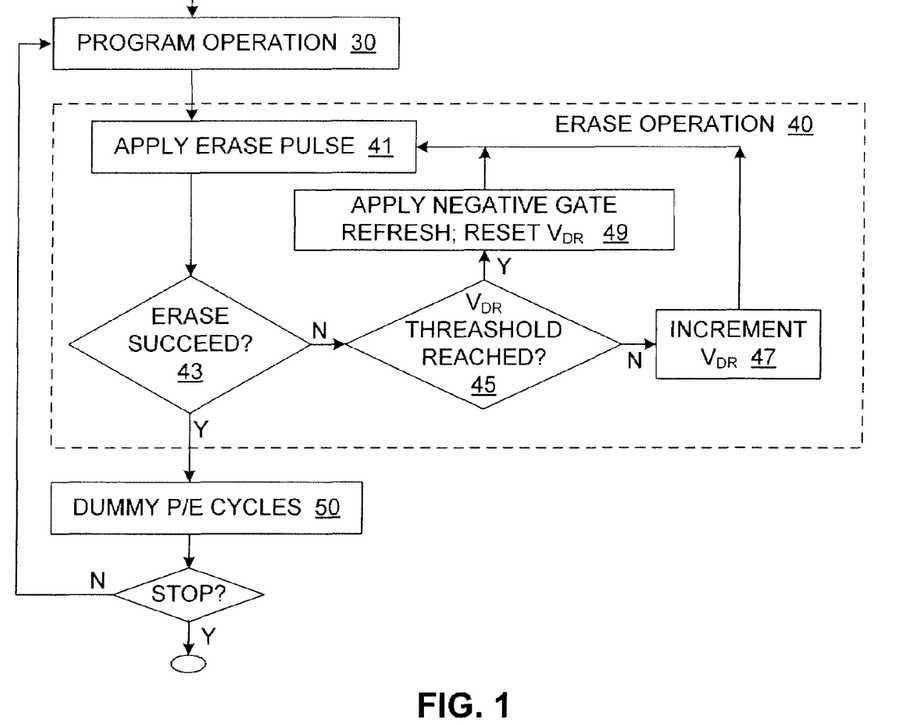
FIG. 1 is a simplified flow diagram showing a method for operating a NROM cell using a novel cycling procedure according to an embodiment of the present invention.

FIG. 1 is a simplified flow diagram showing a method for operating a nitride read only memory (NROM) non-volatile memory cell using a novel cycling procedure. The novel cycling procedure is described immediately below with reference to conventional NROM cell 100 (described above), and is described further below with reference to novel NROM cells that are modified to facilitate the novel cycling procedure.

In general, during its operational lifetime, the NROM cell is subjected to alternating programming operations 30 and erase operations 40, and optional "dummy" program and erase cycles 50 that are used for the decrease of test time. As set forth above, conventional NROM cells subjected to normal operating conditions exhibit an average endurance of about 1 million program/erase cycles. In accordance with an embodiment of the present invention, the novel cycling procedure is selectively performed during erase operation 40, which is depicted in the middle of FIG. 1.

Referring to the upper portion of FIG. 1, program operation 30 is performed using conventional techniques. In one embodiment, programming involves applying a positive voltage (e.g., from 8V to 9V) to the control gate and a positive voltage (e.g., from 5V to 6V) to the selected drain region (e.g., either region 111 or 112 in FIG. 10, depending on the charge trapping region to be programmed) while the other source/drain region (112 or 111) is grounded. Under these conditions, the channel electrons are accelerated in the lateral field, and electrons eventually achieve sufficient energy to be injected into the silicon nitride layer of the ONO structure by hot electron injection. During subsequent read operations, the thus-programmed NROM cell exhibits a relatively high threshold voltage that is interpreted by the memory device as being a stored logic "0" (or logic "1", depending on the adopted convention).

Once the data stored in the NROM cell is no longer needed, then NROM cell is subjected to erase operation 40 to prepare the NROM cell for subsequent data storage operations. Similar to conventional NROM memory operating procedures, each erase operation begins (block 41) with the application of an erase pulse (e.g., from 0 to −3V to the gate (i.e., control gate 140) and from 4.5V to 6.5V to the drain (e.g., drain region 112) for 10 milliseconds to 100 milliseconds) across a selected charge trapping region (e.g., charge trapping region 122R; FIG. 10). As described above, the applied gate voltage and selected drain voltage VDR are selected to generate a band-to-band tunneling mechanism that injects holes from the drain region (e.g., drain region 112) into the ONO structure, and particularly into the targeted charge trapping region (e.g., charge trapping region 122R).

After each erase pulse, the selected NROM cell is tested using known techniques to determine if the targeted charge trapping region (e.g., charge trapping region 122R; FIG. 10) has achieved a predetermined erased state (block 43). This testing is performed, for example, by determining whether the threshold voltage of the NROM cell is below/above a predetermined minimum/maximum threshold voltage value. If the selected NROM cell is successfully erased ("Yes" branch of block 43), then operation of the NROM cell proceeds with optional dummy P/E cycles (block 50), and is then typically ready for a subsequent program operation (block 30). Note that the optional dummy P/E cycles (block 50) are used to decrease the time of the test procedure (verify operation is not performed during the "dummy" cycles but performed after the "dummy" sequence).

In accordance with the novel cycling procedure, when the targeted charge trapping region (e.g., charge trapping region 122R; FIG. 10) has not achieved the predetermined erased state ("No" branch of block 43), the voltage level of the selected drain voltage $V_{DR}$ that was used during the preceding erase pulse (block 41) is compared against a predetermined threshold (maximum) value (block 45). If the selected drain voltage $V_{DR}$ is less than the predetermined threshold voltage value (No branch in block 45), the drain voltage $V_{DR}$ is increased by a predetermined incremental voltage amount (block 47), and then the erase pulse is repeated (block 41) using the increased drain voltage $V_{DR}$. In this manner, as the number of electrons trapped far from the drain region gradually increases over time, an incrementally increasing drain voltage $V_{DR}$ is employed to achieve the desired erased state. Conversely, when the selected drain voltage $V_{DR}$ reaches (e.g., becomes greater than) the predetermined threshold voltage value ("Yes" branch in block 45), as indicated by block 49, a negative gate refresh voltage is applied to the control gate of the selected NROM (e.g., control gate 140; FIG. 10) at a level that causes holes enter the ONO structure from the substrate (i.e., through channel region 113; FIG. 10), thereby "refreshing" the selected NROM cell such that the required drain voltage $V_{DR}$ needed to achieve the desired erased state is "reset" to a relatively low value. Following the refresh operation, and then the erase pulse is repeated (block 41) using the increased drain voltage $V_{DR}$, and the operation is resumed in the manner described above.

Figure 2:
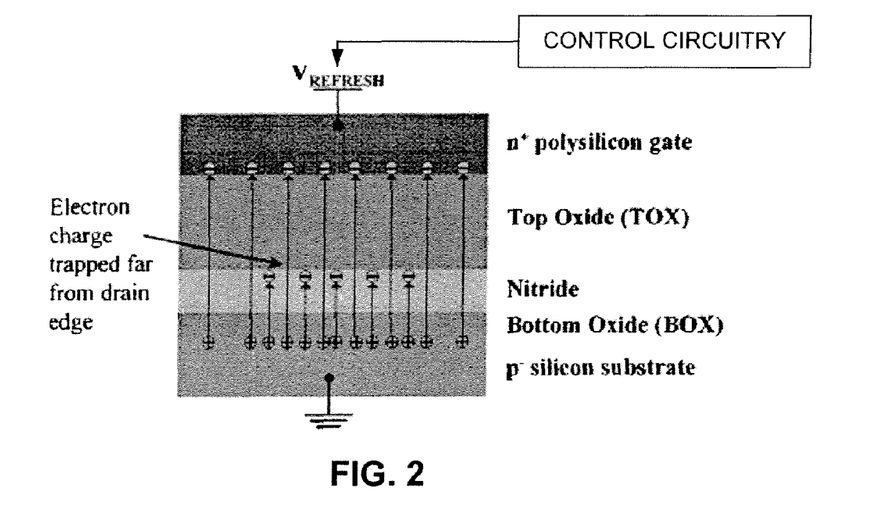
FIG. 2 is a simplified diagram illustrating the refresh operation utilized in the novel cycling procedure of FIG. 1.

FIG. 2 is a simplified diagram illustrating the refresh operation generated in response to the negative gate voltage described above with reference to block 49. As described in the background section above, the endurance of an NROM cell is limited due to inability to erase the parasitic electrons trapped in BOX layer and Nitride layer far from the drain edge, as well as due to hot carrier degradation of the BOX layer. The hot carriers create traps in the BOX layer during program/erase cycling, which are filled by the parasitic electrons, so the positive feedback degradation loop is closed (trap creation—electron trapping—erase voltage increases—more holes injected—more trap generation in the BOX far from the drain). The refresh operation of the present invention is used to disrupt the above mentioned positive feedback degradation loop. FIG. 2 depicts the electrons (−) that are trapped in the central region of the ONO structure at a location that is far from the drain edge and charge trapping regions (e.g., in central region 122C; see FIG. 10). As indicated, the applied gate refresh voltage $V_{REFRESH}$ causes holes (+) to be injected through the ONO structure. Some of these injected holes recombine with the electrons trapped in the nitride layer, thereby refreshing the NROM cell (i.e., causing the threshold voltage of the NROM cell to revert to its initial state). Thus, in accordance with the novel cycling procedure illustrated in FIG. 1, when the drain erase voltage (which grows logarithmically with the number of program/erase cycles) reaches the predetermined threshold value, a refresh operation is performed such that the drain erase voltage returns to its initial value, and then cycling continues. Using this approach, an operational lifetime endurance of more than 10,000,000 cycles was achieved for the first time for NROM memories.

In accordance with another aspect of the invention, a modified NROM structure is proposed to suppress the injection of electrons into the ONO structure from the gate electrode and/or to increase the flow of holes from the substrate in response to the applied negative gate refresh voltage $V_{REFRESH}$. It is known that electrons are usually easier to inject into $SiO_2$ than holes due to lower injection barrier. Thus, if the above-described refresh operation were applied to a conventional NROM cell, the number of electrons entering the ONO structure from the control gate exceeds the number of holes entering the ONO structure from the substrate, resulting in a net increase in trapped electrons. In order to prevent this undesirable outcome, the present invention is preferably implemented using NROM cells that are modified to suppress electron injection from the control gate while facilitating or increasing the injection of holes from the substrate. Two specific embodiments of such modified NROM cells are described below with reference to FIGS. 3 and 4.

Figure 3:
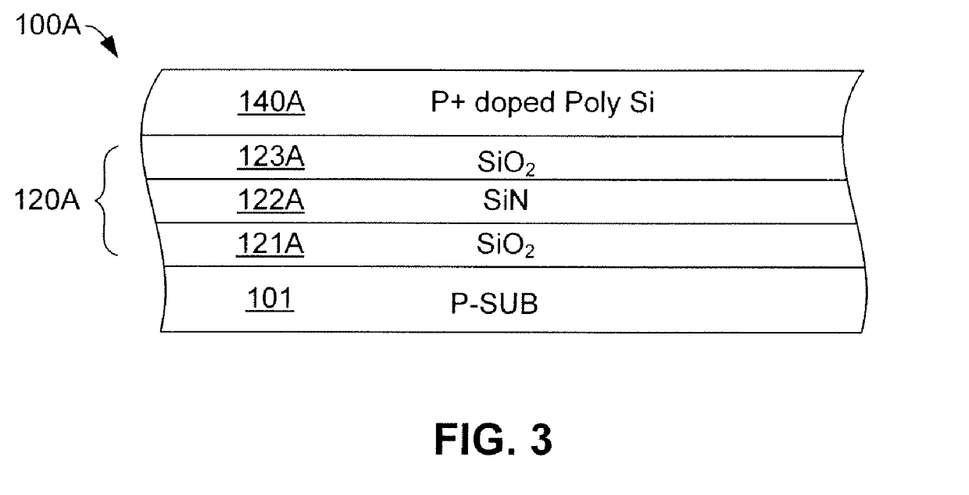
FIG. 3 is a cross-sectional side view showing a portion of a first modified NROM cell according to a specific embodiment of the present invention.

FIG. 3 is a cross-sectional side view showing a portion of an NROM cell 100A that is modified to inhibit electron injection from the control gate while facilitating the injection of holes from the substrate during the refresh operation (described above) in accordance with a first exemplary embodiment. NROM cell 100A includes an ONO structure 120A formed on a P-type substrate 101, and a polysilicon control gate 140A formed on ONO structure 120A, which is similar to conventional NMOS cell 100 (described above). However, in this embodiment, control gate 140A is P+ doped (i.e., instead of N+ doped as in conventional NMOS cell 100), thereby increasing the injection barrier for electrons entering ONO structure 120A from control gate 140A. In addition, to increase the flow of holes from substrate 101 into ONO structure 120A, BOX layer 121A is formed with a reduced "near-tunneling" thickness (e.g., in a range of 25 A to 35 A, in contrast to a thickness of 50 A-70 A utilized in typical conventional NMOS cells).

Figure 4:
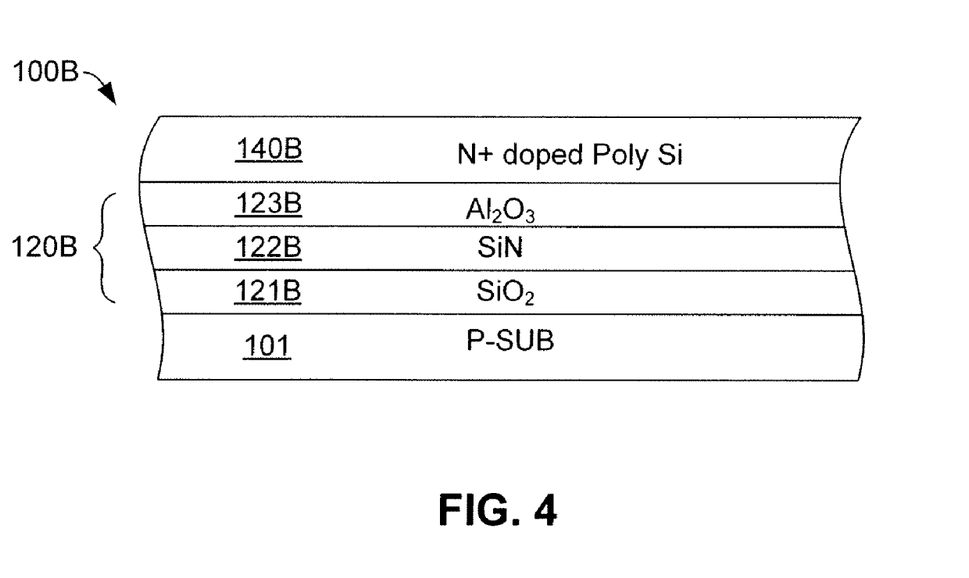
FIG. 4 is a cross-sectional side view showing a portion of a second modified NROM cell according to another specific embodiment of the present invention.

FIG. 4 is a cross-sectional side view showing a portion of an NROM cell 100B that is modified to inhibit electron injection from the control gate while facilitating the injection of holes from the substrate during the refresh operation in accordance with a second exemplary embodiment. NROM cell 100B includes an ONO structure 120B formed on a P-type substrate 101, and an N+ doped polysilicon control gate 140B formed on ONO structure 120A, which is similar to conventional NMOS cell 100 (described above). However, in this embodiment, TOX layer 123B is formed using Alumina (i.e., Aluminum Oxide ($Al_2O_3$), instead of $SiO_2$, which is used in conventional NROM cells), thereby increasing the injection barrier for electrons entering ONO structure 120B from control gate 140B. In this embodiment, the flow of holes from substrate 101 into ONO structure 120A is not enhanced (i.e., BOX layer 121A is formed with a conventional thickness (e.g., 50 A).

Those skilled in the art will recognize that the structures disclosed in FIGS. 3 and 4 are exemplary, and that other structures and materials may be utilized to achieve the desired decrease in electron injection and/or increase in hole injection.

Feasibility

A feasibility study was done with Tower microFlash NROM cells in a first fabrication facility ("Fab 1") utilizing 0.5 um technology production equipment and methods, and a second fabrication facility ("Fab 2") utilizing 0.18 um technology equipment and methods. In each of these facilities NROM cells meeting the description provided above were subjected to the operational process described above with reference to FIG. 1.

Figures 5A, 5B, 5C:
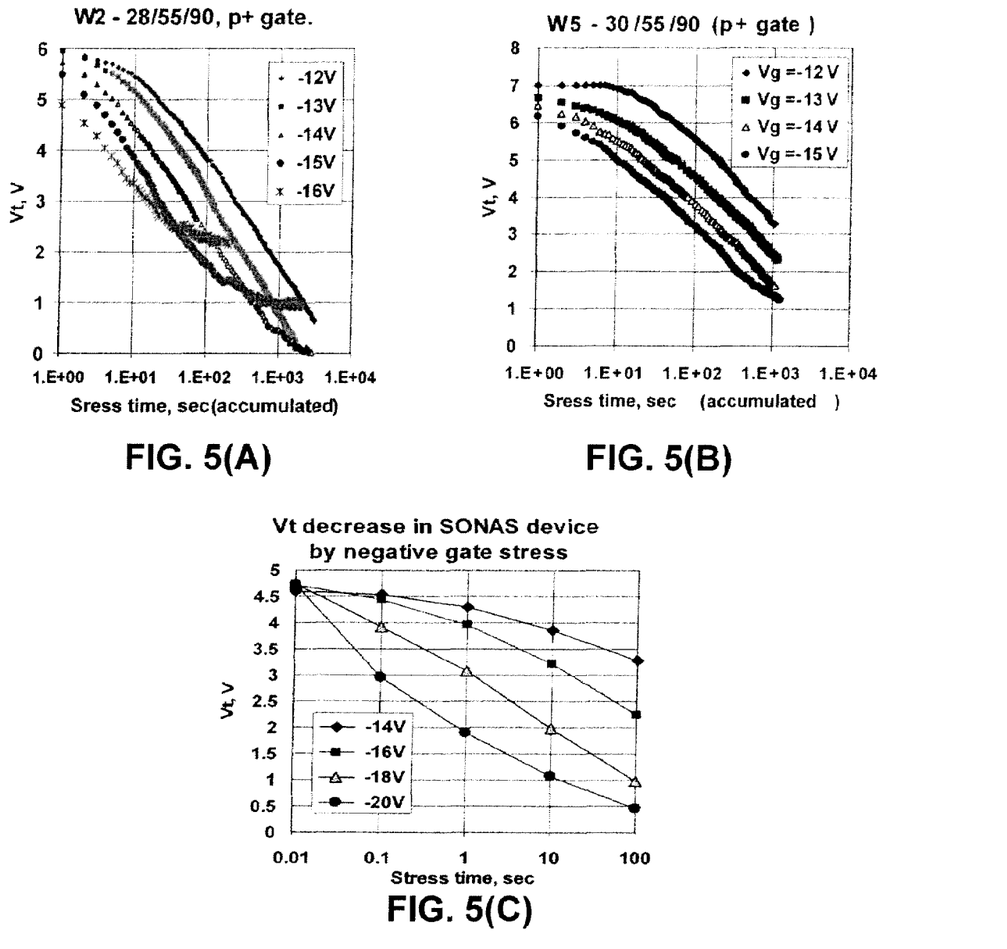
FIGS. 5(A), 5(B) and 5(C) are diagrams illustrating experimental data generated using the novel NMOS cells of FIGS. 3 and 4.

In a first stage, the present inventors checked whether the NROM cells could be erased uniformly by the negative gate stress (i.e., whether uniform hole injection from bulk may be performed by application of the negative gate stress). With this aim, the inventors charged the NROM cell using a positive gate stress, and then applied the negative gate stress in accordance with the voltage levels and time periods presented in FIGS. 5(A) to 5(C). FIGS. 5(A) and 5(B) illustrate experimental data generated using NMOS cell 100A (described above with reference to FIG. 3), and FIG. 5(C) illustrates experimental data generated using NMOS cell 100B (described above with reference to FIG. 4). This data generally shows dominating hole injection into the Nitride by the Fowler-Nordheim mechanism, which is not registered in the ONO of conventional NROM.

Figure 6:
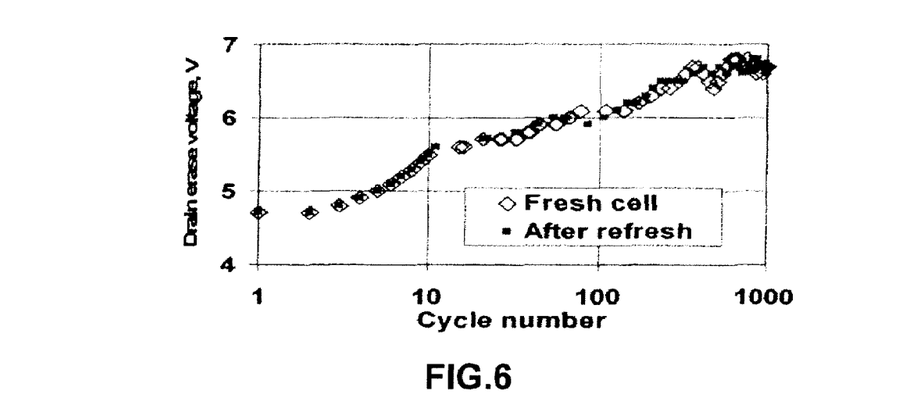
FIG. 6 is a graph indicating the change in the drain erase voltage of NROM cells during cycling.

In a second stage, the inventors confirmed the fact of erasing the parasitic electrons after applying the negative refresh voltage, the drain erase voltage returns to its initial value. In particular, FIG. 6 is a graph indicating the change in drain erase voltage Vd during cycling. During cycling the Vd voltage needed to reach the erase level grows due to accumulation of electrons far from the drain edge in the ONO structure. After performing a refresh operation with $V_{REFRESH}$=approximately −12V (i.e., ±10%) for a time duration of approximately 20 seconds, the parasitic electrons are removed and the drain erase voltage is returned to its initial value. In this embodiment, the ONO layer included a Bottom Oxide layer having a thickness of 25 A (angstroms), a Nitride layer of 55 A, and a Top Oxide layer of 120 A.

Figure 7A:
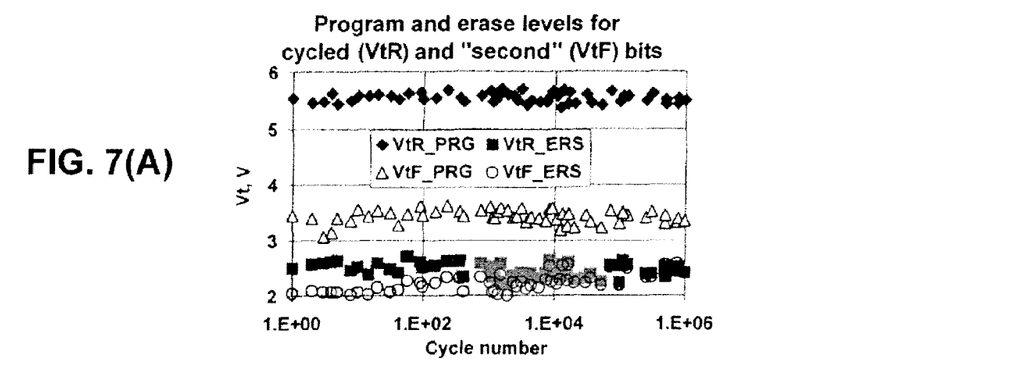
FIGS. 7(A), 7(B), 7(C) and 7(D) are diagrams illustrating experimental data associated with program/erase cycle endurance associated with devices fabricated in accordance with alternative embodiments of the present invention.
Figure 7B:
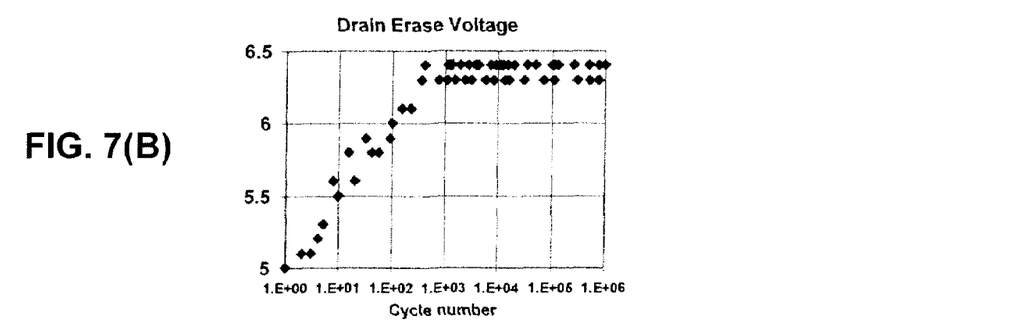
Figure 7C:
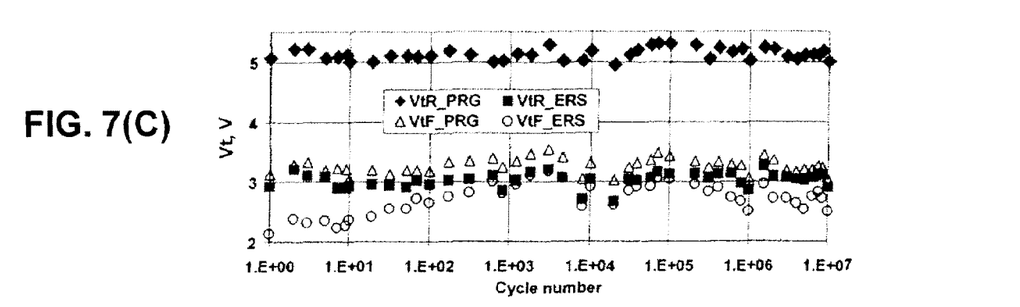
Figure 7D:
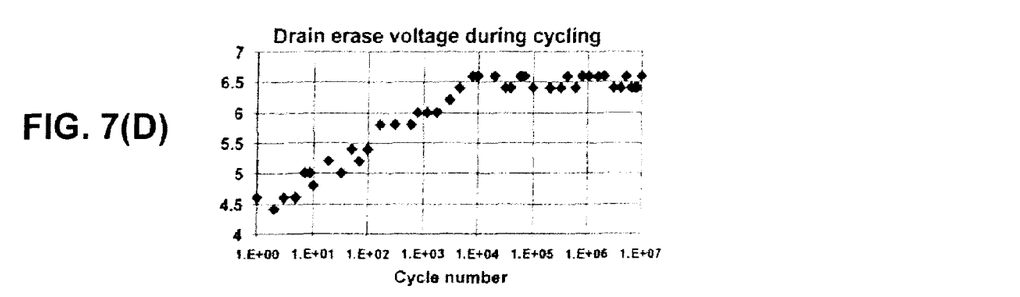

Finally, the inventors integrated the refresh operation into the cycling algorithm. The negative refresh gate stress is applied to a NROM cell when the drain erase voltage reaches some threshold value (e.g., approximately 6 to 6.5V). Using this approach, NROM cell endurance achieved one million cycles using the production facilities of Fab 1 (FIGS. 7(A) and 7(B)), and 10 million cycles using the production facilities of Fab 2 (FIGS. 7(C) and 7(D)). Note that in the Fab 1 experiment, the ONO layer included a Bottom Oxide layer having a thickness of 25 A (angstroms), a Nitride layer of 55 A, and a Top Oxide layer of 120 A, and in the Fab 2 experiment, the ONO layer included a Bottom Oxide layer having a thickness of 28 A (angstroms), a Nitride layer of 55 A, and a Top Oxide layer of 90 A. In each case a retention bake (250° C./1 h) was performed after cycling indicated that there was still a 1.3V memory window left in case of 1 M cycles, and 530 mV in case of 10 M cycles.

Figure 8:
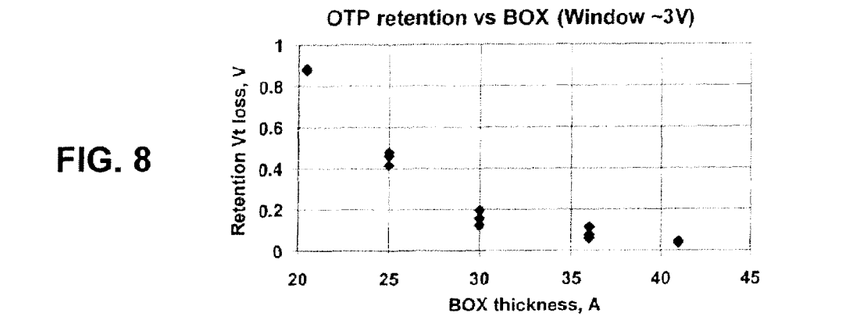
FIG. 8 is a diagram showing experimental OTP retention data for exemplary NROM cells having different Bottom Oxide thicknesses according to another aspect of the present invention.

FIG. 8 is a diagram showing OTP retention for samples having different Bottom Oxide thicknesses. The minimum BOX thickness was estimated in special experiments. The maximum retention loss for SONOS capacitors programmed to 3V above the initial threshold voltage ($Vt_{PRG}=Vt_{initial}+3V$) is shown in FIG. 8. The bake was 250° C./1 h.

Figure 9A:
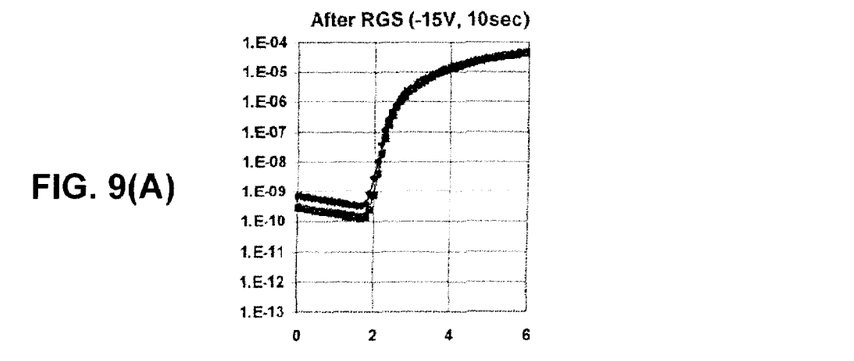
FIGS. 9(A), 9(B) and (C) are diagrams showing changes in Ioff of NROM cells in response to alternative erase operations according to another aspect of the present invention.
Figure 9B:
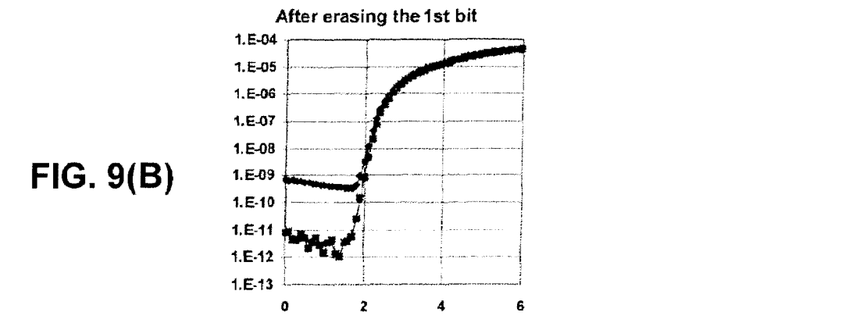
Figure 9C:
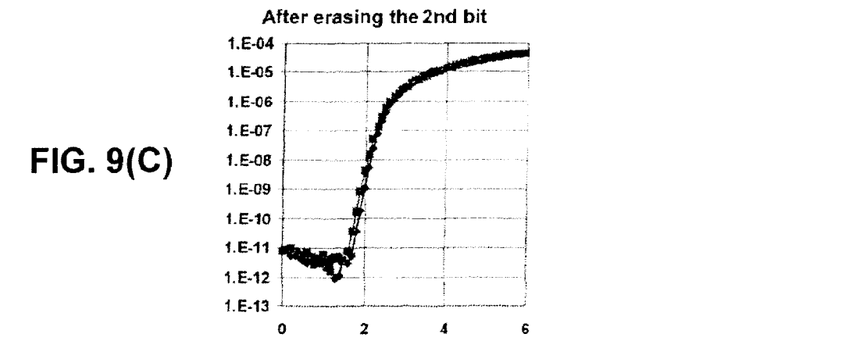

In some cases the inventors observed an increase of Ioff after the refresh gate stress was applied (FIG. 9(A)). The Ioff was connected with enhanced drain diode leakage. The Ioff can be decreased to its initial value by erasing of each side of the cell directly after refresh (FIGS. 9(B) and 9(C)).

Figure 12:
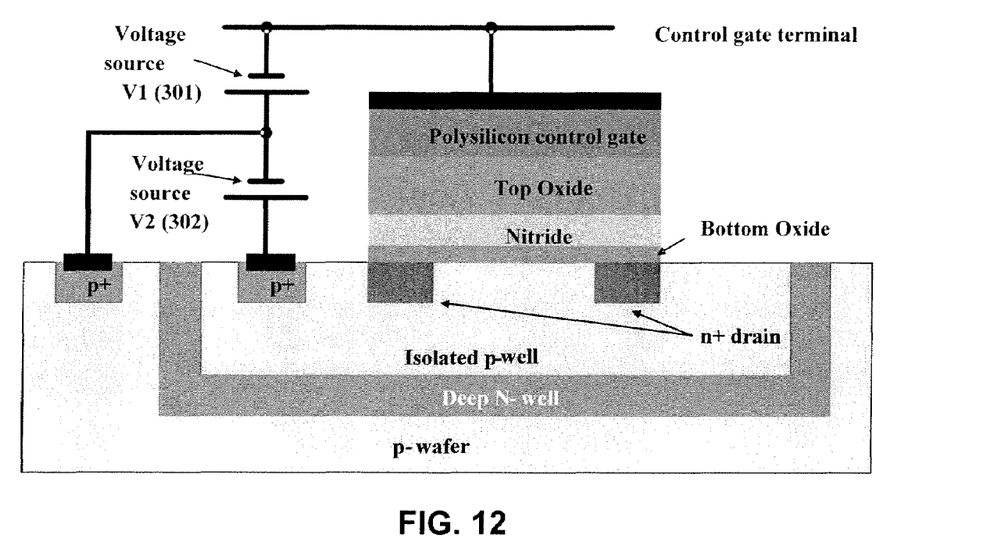
FIG. 12 is a simplified cross-sectional side view illustrating NROM cell in isolated P-well to divide refresh voltage.

In accordance with an embodiment of the present invention, in order to decrease the absolute value of voltages used for the refresh, the memory array is placed into an isolated P-well (FIG. 12). The voltage used for the refresh is divided into two parts: V1 and V2. Two independent voltage sources (e.g., charge pumps 301, 302) are connected in series between the control gate and the isolated p-well, where |V1|+|V2|=$V_{REFRESH}$.

Figure 13:
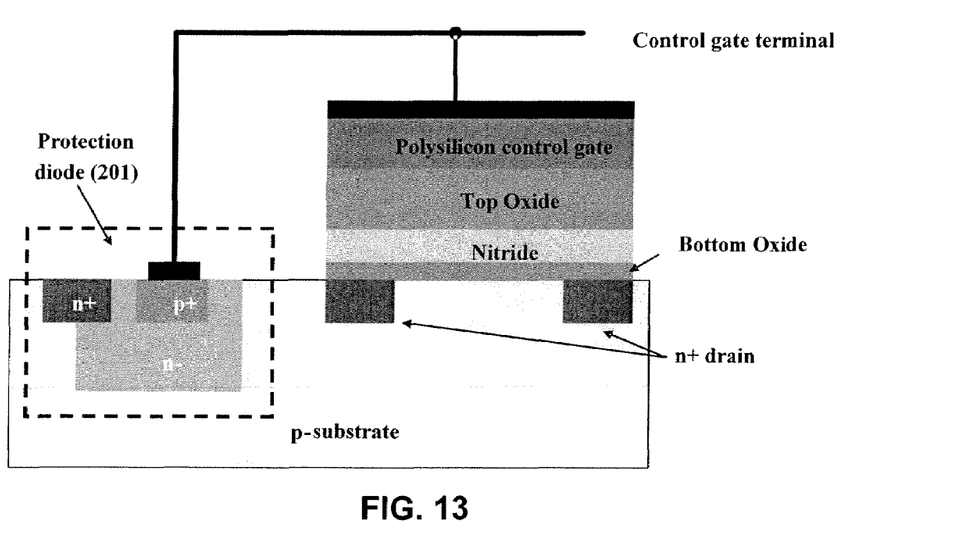
FIG. 13 is a simplified cross-sectional side view illustrating NROM cell with protection diode connected to control gate of the cell.
Figure 14:
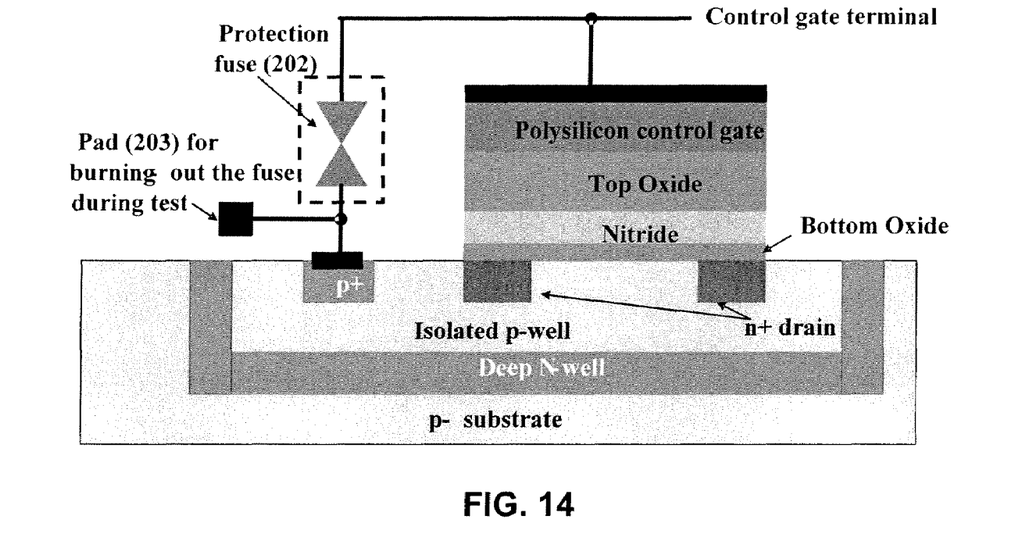
FIG. 14 is a simplified cross-sectional side view illustrating NROM cell with protection fuse connected to control gate of the cell and pad connected to isolated P-well for burning the fuse.

In the developed practical designs, the control gate of the proposed cell is supplied with the protection circuit against the plasma charging shown in FIG. 13. The idea of U.S. Pat. No. 6,329,691, issued Nov. 12, 2002 is used, but the p+/n− diode (201) has |Vbreakdown|>|Vrefresh|. In an alternative embodiment (FIG. 14), a memory cell is supplied with a fuse (202) for protection from process charging. A pad (203) is connected to the ground during the burn-off procedure.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for operating a nitride read only memory (NROM) non-volatile memory (NVM) cell having a source region and a drain region formed in a substrate, and an oxide-nitride-oxide (ONO) structure formed on the substrate and having a first charge trapping region located over the source region, a second charge trapping region located over the drain region, and a central region extending between the first and second charge trapping regions, and a polycrystalline silicon control gate disposed over the ONO structure, the method comprising:
- (a) applying an erase pulse across the second charge trapping region by generating a positive drain voltage in the drain region and a first negative voltage in the control gate;
- (b) determining if the second charge trapping region has achieved a predetermined erased state in response to the applied erase pulse;
- (c) when the second charge trapping region has not achieved the predetermined erased state in (b), determining if the positive drain voltage applied to the drain region during (a) is greater than a predetermined voltage level; and
- (d) when the positive drain voltage is greater than the predetermined voltage level in (c), applying a second negative refresh voltage to the control gate such that holes enter the ONO structure from the substrate, and then repeating (a) and (b).

2. The method according to claim 1, wherein applying the erase pulse comprises generating a first negative gate voltage having a voltage level in the range of −0V to −5V for a duration in the range of 10 to 100 milliseconds.

3. The method according to claim 2, further comprising, when the positive drain voltage is less than the predetermined voltage level in (c), increasing the positive drain voltage by a predetermined incremental voltage amount, and then repeating (a) and (b) using the increased positive drain voltage.

4. The method according to claim 2, wherein applying the negative refresh voltage comprises applying a voltage in the range of −12V to −20V for a period in the range of 1 millisecond to 100 seconds.

5. The method according to claim 1, further comprising, after applying the second negative refresh voltage, decreasing the positive drain voltage by a second predetermined incremental voltage amount before repeating (a) and (b), wherein repeating (a) comprises using the decreased positive drain voltage.

6. An integrated circuit comprising:
a substrate;
a nitride read only memory (NROM) cell having a source region and a drain region formed in a substrate, and an oxide-nitride-oxide (ONO) structure formed on the substrate and having a first charge trapping region located over the source region, a second charge trapping region located over the drain region, and a central region extending between the first and second charge trapping regions, and a polycrystalline silicon control gate disposed over the ONO structure; and
control circuitry for controlling program and erase operations of the NROM cell, the control circuit including:
- (a) means for applying an erase pulse across the second charge trapping region by generating a positive drain voltage in the drain region and a first negative voltage in the control gate;
- (b) first determining means for determining if the second charge trapping region has achieved a predetermined erased state in response to the applied erase pulse;
- (c) second determining means for determining if the positive drain voltage applied to the drain region during (a) is greater than a predetermined voltage level when the second charge trapping region has not achieved the predetermined erased state in (b); and
- (d) means for applying a second negative voltage to the control gate such that holes enter the ONO structure from the substrate, and then repeating (a) and (b) when second determining means determines that the positive drain voltage is greater than the predetermined voltage level in (c).

7. The IC of claim 6, further comprising at least one of means for inhibiting electron injection from the control gate into the ONO structure and means for stimulating hole injection from substrate into the ONO structure.

8. The IC of claim 7, wherein a bottom oxide layer of the ONO structure has a thickness in the range of 25 A to 35 A.

9. The IC of claim 7, wherein the control gate comprises P+ doped polycrystalline silicon.

10. The IC of claim 7, wherein an upper oxide layer of the ONO structure comprises Alumina.

11. The IC of claim 7, further comprising means for increasing the positive drain voltage by a predetermined incremental voltage amount when the positive drain voltage is less than the predetermined voltage level in (c).

12. The IC of claim 7, further comprising means for decreasing the positive drain voltage by a second predetermined incremental voltage amount before repeating (a) and (b) after applying the second negative voltage, wherein subsequently repeating (a) comprises using the decreased positive drain voltage.

* * * * *